(12) United States Patent
Tanaka et al.

(10) Patent No.: US 10,916,706 B2
(45) Date of Patent: Feb. 9, 2021

(54) COMPOSITION, FILM PRODUCTION METHOD, AND LIGHT EMITTING DEVICE

(71) Applicant: Sumitomo Chemical Company, Limited, Tokyo (JP)

(72) Inventors: Masanobu Tanaka, Tsukuba (JP); Motoo Noda, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/480,719

(22) PCT Filed: Jan. 23, 2018

(86) PCT No.: PCT/JP2018/001941
§ 371 (c)(1),
(2) Date: Jul. 25, 2019

(87) PCT Pub. No.: WO2018/139442
PCT Pub. Date: Aug. 2, 2018

(65) Prior Publication Data
US 2019/0386222 A1    Dec. 19, 2019

(30) Foreign Application Priority Data

Jan. 27, 2017 (JP) ................................ 2017-012846

(51) Int. Cl.
| | | |
|---|---|---|
| *H01L 51/00* | (2006.01) | |
| *C09D 11/52* | (2014.01) | |
| *C08G 61/10* | (2006.01) | |
| *C09D 11/102* | (2014.01) | |
| *C09D 11/30* | (2014.01) | |
| *H01L 51/50* | (2006.01) | |

(52) U.S. Cl.
CPC .......... *H01L 51/0039* (2013.01); *C08G 61/10* (2013.01); *C09D 11/102* (2013.01); *C09D 11/30* (2013.01); *C09D 11/52* (2013.01); *H01L 51/0043* (2013.01); *C08G 2261/124* (2013.01); *C08G 2261/143* (2013.01); *C08G 2261/148* (2013.01); *C08G 2261/1412* (2013.01); *C08G 2261/1424* (2013.01); *C08G 2261/1426* (2013.01); *C08G 2261/18* (2013.01); *C08G 2261/228* (2013.01); *C08G 2261/312* (2013.01); *C08G 2261/3142* (2013.01); *C08G 2261/95* (2013.01); *H01L 51/0005* (2013.01); *H01L 51/5016* (2013.01)

(58) Field of Classification Search
CPC .......... H01L 51/00; C09D 11/30; C09D 11/52
USPC ........................................................ 438/46
See application file for complete search history.

(56) References Cited

U.S. PATENT DOCUMENTS

| | | | |
|---|---|---|---|
| 2010/0267180 A1 | 10/2010 | Kojima et al. | |
| 2016/0181531 A1 | 6/2016 | Terui et al. | |
| 2019/0048131 A1 | 2/2019 | Iijima et al. | |

FOREIGN PATENT DOCUMENTS

| | | | |
|---|---|---|---|
| JP | 2010192369 A | 9/2010 | |
| JP | 2013166871 A | 8/2013 | |
| JP | 2013200941 A | 10/2013 | |
| JP | 2014044972 A | 3/2014 | |
| JP | 2015038976 A | 2/2015 | |
| JP | 2017183409 A | 10/2017 | |
| WO | 2009063850 A1 | 5/2009 | |
| WO | 2012063656 A1 | 5/2012 | |

OTHER PUBLICATIONS

International Search Report dated Apr. 3, 2018 in International Application No. PCT/JP2018/001941.
Written Opinion dated Apr. 3, 2018 in International Application No. PCT/JP2018/001941.

*Primary Examiner* — Khanh T Nguyen
(74) *Attorney, Agent, or Firm* — Panitch Schwarze Belisario & Nadel LLP

(57) ABSTRACT

A composition having excellent dischargeability by an ink jet method and reduced clogging of an ink jet apparatus is provided. The composition contains a fluorinated alcohol A represented by the formula (1) and having a boiling point of 50° C. or more and less than 150° C., a fluorinated alcohol B represented by the formula (1) and having a boiling point of 150° C. or more and less than 300° C., and a charge transportable compound, in which the ratio rate of the fluorinated alcohol B with respect to 100 parts by mass of the sum of the fluorinated alcohol A and the fluorinated alcohol B is 10 parts by mass to 90 parts by mass:

$$C_{nF}H_{2nF+1-mF}F_{nF}OH \qquad (1)$$

In formula (1), nF is an integer of 1 to 12 and mF is an integer of 1 to 25, provided that $2nF+1 \geq mF$.

11 Claims, No Drawings

COMPOSITION, FILM PRODUCTION METHOD, AND LIGHT EMITTING DEVICE

CROSS-REFERENCE TO RELATED APPLICATION

This application is a Section 371 of International Application No. PCT/JP2018/001941, filed Jan. 23, 2018, which was published in the Japanese language on Aug. 2, 2018 under International Publication No. WO 2018/139442 A1, which claims priority under 35 U.S.C. § 119(b) to Japanese Application No. 2017-012846, filed Jan. 27, 2017, and the disclosures of which are incorporated herein by reference.

TECHNICAL FIELD

The present invention relates to a composition and production methods of a film and a light emitting device using the composition.

PRIOR ART

In order to improve the properties of a light emitting device such as an organic electroluminescent device and the like, studies are being made to insert various layers between a light emitting layer and an electrode. For example, a method is known in which an electron transporting layer formed by a spin coat method using a solution in which an electron transporting material is dissolved in a fluorinated alcohol having a boiling point of less than 120° C. is inserted between a light emitting layer and an electrode (Patent Document 1).

PRIOR ART DOCUMENT

Patent Document

Patent Document 1: International Publication WO2009/063850

SUMMARY OF THE INVENTION

Problem to be Solved by the invention

However, when forming a film by an inkjet method using the above-described solution, the dischargeablity of the above solution is not necessarily sufficient, and clogging of an inkjet apparatus may occur.

Then, the present invention has an object of providing a composition that is excellent in dischargeability by an ink jet method and is less likely to cause clogging of an ink jet apparatus, and production methods of a film and a light emitting device using the composition.

Means for Solving the Problem

The present invention provides the following [1] to [11].

[1] A composition comprising a fluorinated alcohol A represented by the formula (1) and having a boiling point of 50° C. or more and less than 150° C., a fluorinated alcohol B represented by the formula (1) and having a boiling point of 150° C. or more and less than 300° C. and a charge transportable compound, wherein a ratio of the above-described fluorinated alcohol B with respect to 100 parts by mass of the sum of the above-described fluorinated alcohol A and the above-described fluorinated alcohol B is 10 parts by mass to 90 parts by mass:

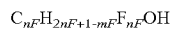

$$C_{nF}H_{2nF+1-mF}F_{nF}OH \qquad (1)$$

(In the formula (1), nF is an integer of 1 to 12 and mF is an integer of 1 to 25, provided that $2nF+1 \geq mF$.).

[2] The composition according to [1], wherein a difference between the boiling point of the above-described fluorinated alcohol A and the boiling point of the above-described fluorinated alcohol B is 50° C. or less.

[3] The composition according to [1] or [2], wherein nF in the above-described fluorinated alcohol A is an integer of 1 to 10 and nF in the above-described fluorinated alcohol B is an integer of 4 to 10.

[4] The composition according to [3], wherein mF in the above-described fluorinated alcohol A is an integer of 4 to 12 and mF in the above-described fluorinated alcohol B is an integer of 4 to 12.

[5] The composition according to any one of [1] to [4], wherein the above-described fluorinated alcohol A and the above-described fluorinated alcohol B are each a linear alcohol.

[6] The composition according to any one of [1] to [5], wherein the above-described charge transportable compound is at least one selected from the group consisting of aromatic hydrocarbon compounds, aromatic heterocyclic compounds, organic silane compounds, alkali metal salts and alkaline earth metal salts of aromatic hydrocarbon compounds, alkali metal salts and alkaline earth metal salts of aromatic heterocyclic compounds, alkali metal salts and alkaline earth metal salts of organic silane compounds, halides, oxide salts and carbonates of alkali metals, halides, oxide salts and carbonates of alkaline earth metals, and metal complexes.

[7] The composition according to any one of [1] to [6], wherein the above-described charge transportable compound is a polymer compound.

[8] The composition according to any one of [1] to [7], further comprising water. [9] The composition according to any one of [1] to [8], further comprising a solvent having a surface tension higher than that of the above-described fluorinated alcohol A and the above-described fluorinated alcohol B and having a boiling point higher than that of the above-described fluorinated alcohol A and the above-described fluorinated alcohol B.

[10] A production method of a film, comprising a step of forming a film by an application method using the composition according to any one of [1] to [9].

[11] A production method of a light emitting device, comprising a step of forming a layer by an application method using the composition according to any one of [1] to [9].

Effect of the Invention

According to the present invention, a composition that is excellent in dischargeability by an ink jet method and is less likely to cause clogging of an ink jet apparatus, and production methods of an organic film and a light emitting device using the composition can be provided.

Suitable embodiments of the present invention will be illustrated in detail below.

<Explanation of Common Terms>

Terms commonly used in the present specification have the following meanings unless otherwise stated.

Me represents a methyl group, Et represents an ethyl group, Bu represents a butyl group, i-Pr represents an isopropyl group and t-Bu represents a test-butyl group.

The hydrogen atom may be a heavy hydrogen atom or a light hydrogen atom.

In the formula representing a metal complex, the solid line representing a bond to the central metal means a covalent bond or a coordinate bond.

The "polymer compound" denotes a polymer having molecular weight distribution and having a polystyrene-equivalent number-average molecular weight of $1\times10^3$ to $1\times10^8$.

The polymer compound may be any of a block copolymer, a random copolymer, an alternating copolymer or a graft copolymer, and may also take another form.

The end group of a polymer compound is preferably a stable group since if the polymerization active group is left as it is, the light emission characteristics or the luminance life may be reduced when the polymer compound is used for fabrication of a light emitting device. The end group of a polymer compound is preferably a group conjugated with the main chain, and for example, a group connected to an aryl group or a monovalent heterocyclic group bonded to the main chain of a polymer compound via a carbon-carbon bond is mentioned.

The "low molecular compound" denotes a compound having no molecular weight distribution and having a molecular weight of $1\times10^4$ or less.

The "constitutional unit" denotes one or more units present in a polymer compound.

The "alkyl group" may be any of linear or branched. The number of carbon atoms of the linear alkyl group is, not including the number of carbon atoms of the substituent, for example 1 to 50, preferably 3 to 30, more preferably 4 to 20. The number of carbon atoms of the branched alkyl group is, not including the number of carbon atoms of the substituent, for example 3 to 50, preferably 3 to 30, more preferably 4 to 20.

The alkyl group optionally has a substituent and includes, for example a methyl group, an ethyl group, a propyl group, an isopropyl group, a butyl group, a 2-butyl group, an isobutyl group, a test-butyl group, a pentyl group, an iso-amyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom of these groups with a cycloalkyl group, an alkoxy group, a cycloalkoxy group, an aryl group, a fluorine atom and the like, for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl)propyl group and a 6-ethyloxyhexyl group.

The number of carbon atoms of the "cycloalkyl group" is, not including the number of carbon atoms of the substituent, for example 3 to 50, preferably 3 to 30, more preferably 4 to 20.

The cycloalkyl group optionally has a substituent and includes, for example, a cyclohexyl group, a cyclohexylmethyl group and a cyclohexylethyl group.

The "aryl group" denotes an atomic group remaining after removing from an aromatic hydrocarbon one hydrogen atom bonding directly to a carbon atom constituting the ring. The number of carbon atoms of the aryl group is, not including the number of carbon atoms of the substituent, for example 6 to 60, preferably 6 to 20, more preferably 6 to 10.

The aryl group optionally has a substituent and includes, for example, a phenyl group, a 1-naphthyl group, a 2-naphthyl group, a 1-anthracenyl group, a 2-anthracenyl group, a 9-anthracenyl group, a 1-pyrenyl group, 2a-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group, and groups obtained by substituting a hydrogen atom in these groups with an alkyl group, a cycloalkyl group, an alkoxy group, a cycloalkoxy group, an aryl group, a fluorine atom and the like.

The "alkoxy group" may be any of linear or branched. The number of carbon atoms of the linear alkoxy group is, not including the number of carbon atoms of the substituent, for example 1 to 40, preferably 4 to 10. The number of carbon atoms of the branched alkoxy group is, not including the number of carbon atoms of the substituent, for example 3 to 40, preferably 4 to 10.

The alkoxy group optionally has a substituent and includes, for example, a methoxy group, an ethoxy group, a propyloxy group, an isopropvloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom of these groups with a cycloalkyl group, an alkoxy group, a cycloalkoxy group, an aryl group, a fluorine atom and the like.

The number of carbon atoms of the "cycloalkoxy group" is, not including the number of carbon atoms of the substituent, for example 3 to 40, preferably 4 to 10.

The cycloalkoxy group optionally has a substituent and includes, for example, a cyclohexyloxy group.

The number of carbon atoms of the "aryloxy group" is, not including the number of carbon atoms of the substituent, for example 6 to 60, preferably 6 to 48.

The aryloxy group optionally has a substituent and includes, for example, a phenoxy group, a 1-naphthyloxy group, a 2-naphthyloxy group, a 1-anthracenyloxy group, 9a-anthracenyloxy group and a 1-pyrenyloxy group, and groups obtained by substituting a hydrogen atom of these groups with an alkyl group, a cycloalkyl group, an alkoxy group, a cycloalkoxy group, a fluorine atom and the like.

The "p-valent heterocyclic group" (p represents an integer of 1 or more) denotes an atomic group remaining after removing p hydrogen atoms among hydrogen atoms bonding directly to carbon atoms or hetero atoms constituting the ring. Of p-valent heterocyclic groups, preferable are "p-valent aromatic heterocyclic groups" which are atomic groups remaining after removing p--hydrogen atoms among hydrogen atoms bonding directly to carbon atoms or hetero atoms constituting the ring.

The "aromatic heterocyclic compound" denotes a compound in which the hetero ring itself shows aromaticity such as oxadiazole, thiadiazole, thiazole, oxazole, thiophene, pyrrole, phosphole, furan, pyridine, pyrazine, pyrimidine, triazine, pyridazine, guinoline, isoquinoline, azole, diazole, triazole, carbazole, azacarbazole, diazacarbazole, dibenzophosphole and the like, and a compound in which the aromatic ring is condensed to the hetero ring even if the hetero ring itself shows no aromaticity such as phenoxazine, phenothiazine, dibenzoborole, dibenzosilole, benzopyran and the like.

The number of carbon atoms of the monovalent heterocyclic group is, not including the number of carbon atoms of the substituent, for example 2 to 60, preferably 4 to 20.

The monovalent heterocyclic group optionally has a substituent and includes, for example, a thienyl group, a pyrrolyl group, a furyl group, a pyridyl group, a piperidinyl group, a guinolinyl group, an isoguinolinyl group, a pyrimidinyl group and a triazinyl group, and groups obtained by substituting a hydrogen atom in these groups with an alkyl group, a cycloalkyl group, an alkoxy group, a cycloalkoxy group and the like.

The "halogen atom" denotes a fluorine atom, a chlorine atom, a bromine atom or an iodine atom.

The "amino group" optionally has a substituent, and the substituted amino group is preferred. The substituent which the amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-test-butylphenyl) amino group and a bis(3,5-di-tert-butylphenyl)amino group.

The "alkynyl group" may be any of linear or branched. The number of carbon atoms of the linear alkynyl group is, not including the number of carbon atoms of the substituent, for example 2 to 30, preferably 3 to 20. The number of carbon atoms of the branched alkynyl group is, not including the number of carbon atoms of the substituent, for example 3 to 30, preferably 4 to 20.

The number of carbon atoms of the "cycloalkynyl group" is, not including the number of carbon atoms of the substituent, for example 3 to 30, preferably 4 to 20.

The alkenyl group and the cycloalkenyl group optionally have a substituent and include, for example, a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

The "alkynyl group" may be any of linear or branched. The number of carbon atoms of the alkynyl group is, not including the number of carbon atoms of the substituent, for example 2 to 20, preferably 3 to 20. The number of carbon atoms of the branched alkynyl group is, not including the number of carbon atoms of the substituent, for example 4 to 30, preferably 4 to 20.

The number of carbon atoms of the "cycloalkynyl group" is, not including the number of carbon atoms of the substituent, for example 4 to 30, preferably 4 to 20.

The alkynyl group and the cycloalkynyl group optionally have a substituent and include, for example, an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

The "arylene group" denotes an atomic group remaining after removing from an aromatic hydrocarbon two hydrogen atoms bonding directly to carbon atoms constituting the ring. The number of carbon atoms of the arylene group is, not including the number of carbon atoms of the substituent, for example 6 to 60, preferably 6 to 30, more preferably 6 to 18.

The arylene group optionally has a substituent and includes, for example, a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group and a chrysenediyl group, and these groups having a substituent, and preferable are groups represented by the formula (A-1) to the formula (A-20). The arylene group includes groups obtained by bonding a plurality of these groups.

[Chemical Formula 1]

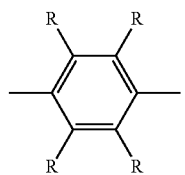
(A-1)

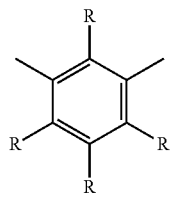
(A-2)

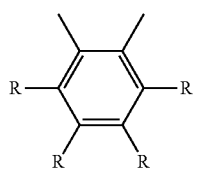
(A-3)

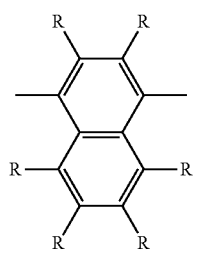
(A-4)

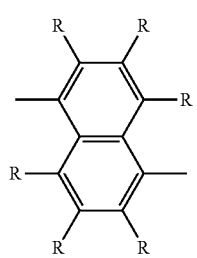
(A-5)

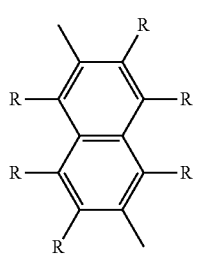
(A-6)

[Chemical Formula 2]

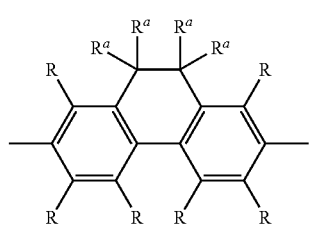
(A-7)

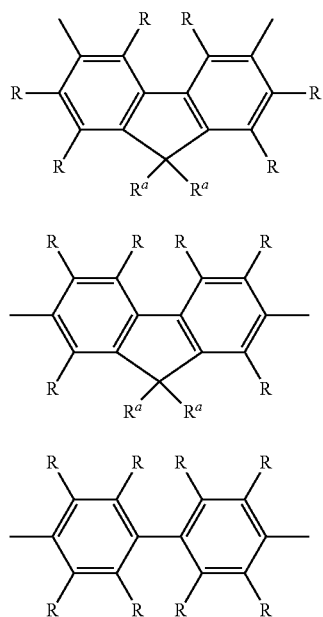
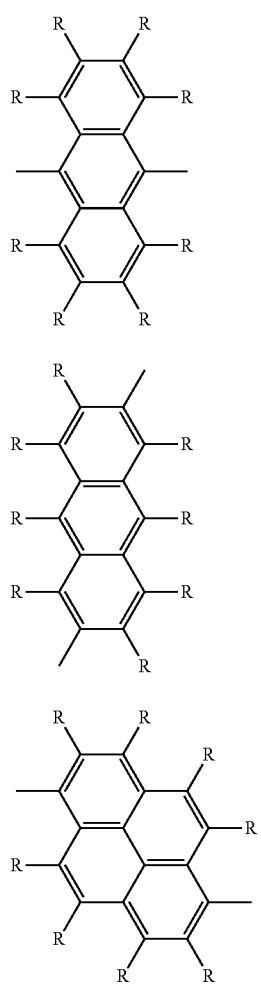
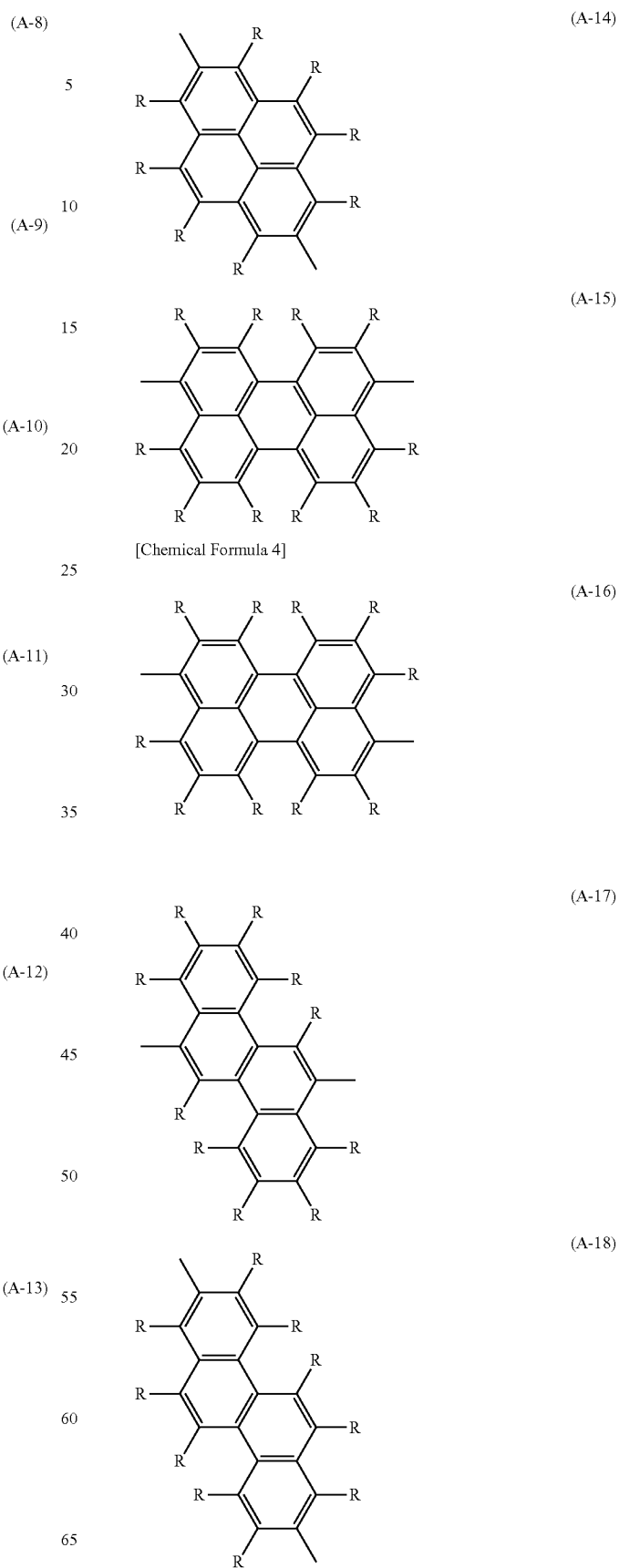
[Chemical Formula 3]
[Chemical Formula 4]

(A-19)

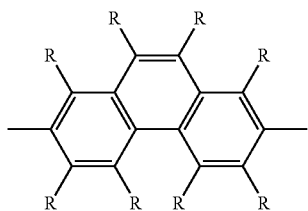

(A-20)

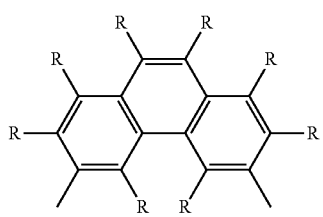

[wherein, R and $R^a$ each independently represent a hydrogen atom, an alkyl group, a cycloalkyl group, an aryl group or a monovalent heterocyclic group. A plurality of R and $R^a$ each may be the same or different, and groups $R^a$ may be combined together to form a ring together with atoms to which they are attached.]

The number of carbon atoms of the divalent heterocyclic group is, not including the number of carbon atoms of the substituent, for example 2 to 60, preferably 3 to 20, more preferably 4 to 15.

The divalent heterocyclic group optionally has a substituent and includes divalent groups obtained by removing from, for example, pyridine, diazabenzene, triazine, azanaphthalene, diazanaphthalene, carbazole, azacarbazole, diazacarbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms bonding directly to carbon atoms or hetero atoms constituting the ring, and preferably, groups represented by the formula (AA-1) to the formula (AA-38). The divalent heterocyclic group includes groups obtained by bonding a plurality of these group.

[Chemical Formula 5]

(AA-1)

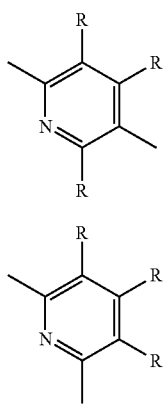

(AA-2)

(AA-3)

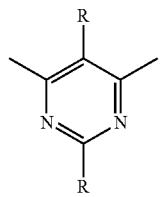

(AA-4)

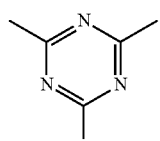

(AA-5)

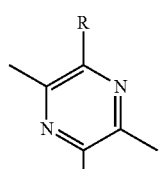

(AA-6)

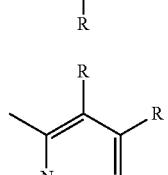

(AA-7)

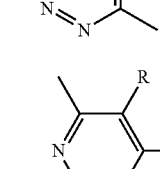

[Chemical Formula 6]

(AA-8)

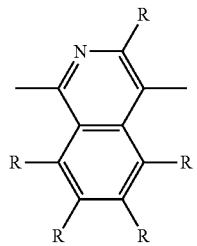

(AA-9)

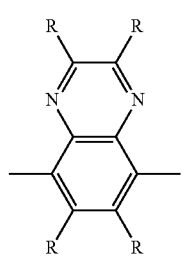

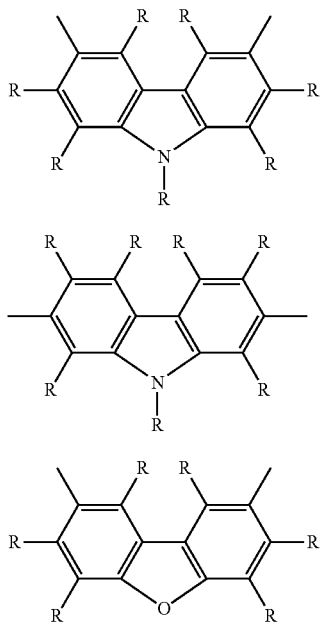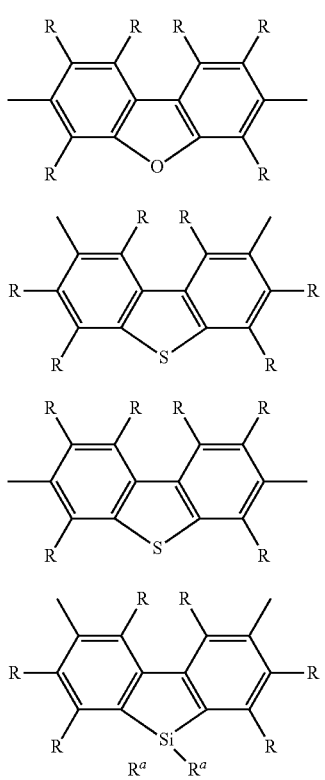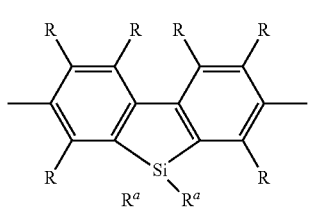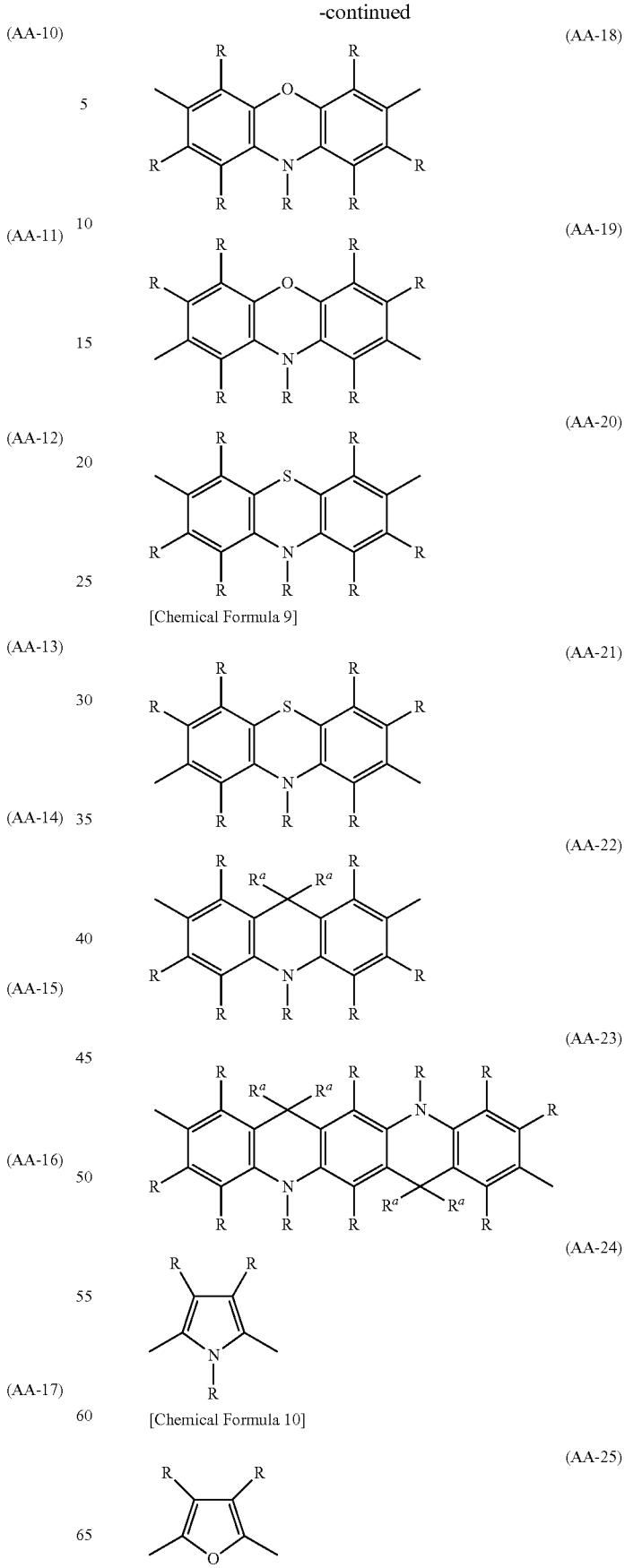

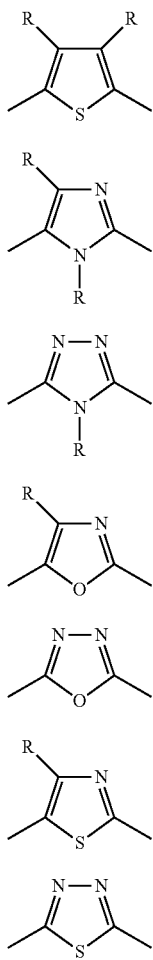
(AA-26)
(AA-27)
(AA-28)
(AA-29)
(AA-30)
(AA-31)
(AA-32)

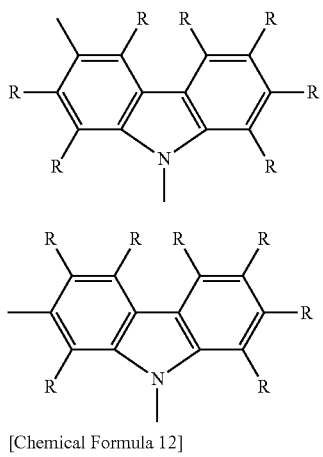

[Chemical Formula 11]

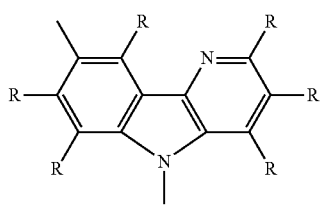

[Chemical Formula 12]

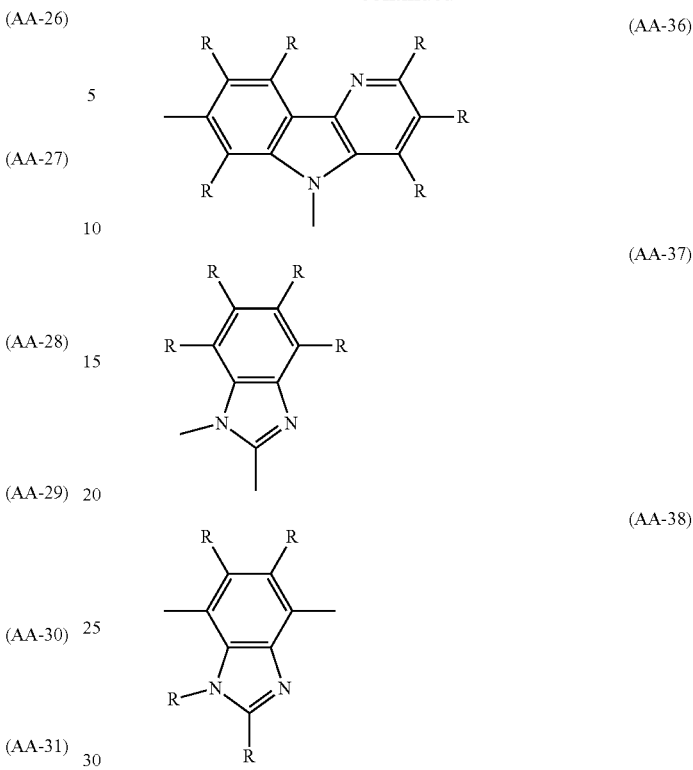
(AA-33)
(AA-34)
(AA-35)
(AA-36)
(AA-37)
(AA-38)

[wherein, R and $R^a$ represent the same meaning as described above.]

The "crosslinking group" is a group capable of generating a new bond by being subjected to heating, ultraviolet irradiation, near ultraviolet irradiation, visible light irradiation, infrared irradiation, radical reaction and the like, preferably, a group represented by any of the formula (B-1) to the formula (B-17). These groups optionally have a substituent.

[Chemical Formula 13]

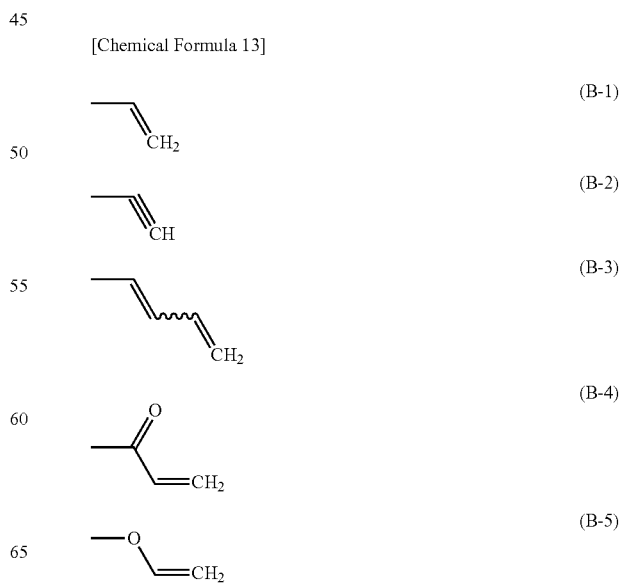
(B-1)
(B-2)
(B-3)
(B-4)
(B-5)

(B-6) 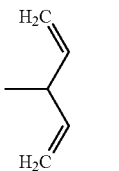

(B-7) 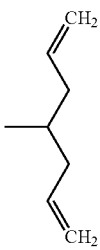

(B-8) 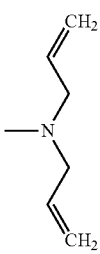

(B-9) 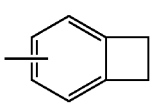

(B-10) 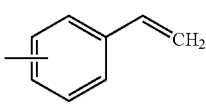

(B-11) 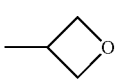

(B-12) 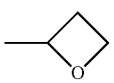

(B-13) 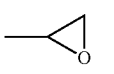

(B-14) 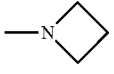

(B-15) 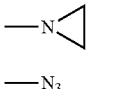

(B-16) —N$_3$ (B-17) 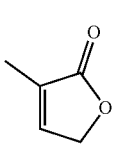

The "substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkynyl group, a cycloalkenyl group, an alkynyl group or a cycloalkynyl group. The substituent may also be a crosslinking group.

<Composition>

The composition of the present invention is a composition comprising a fluorinated alcohol A represented by the above-described formula (1) and having a boiling point of 50° C. or more and less than 150° C., a fluorinated alcohol B represented by the above-described formula (1) and having a boiling point of 150° C. or more and less than 300° C. and a charge transportable compound, wherein the ratio of the above-described fluorinated alcohol B with respect to 100 parts by mass of the sum of the above-described fluorinated alcohol A and the above-described fluorinated alcohol B is 10 parts by mass to 90 parts by mass.

Here, the boiling points of the fluorinated alcohol A and the fluorinated alcohol B are values under standard pressure.

The fluorinated alcohol A and the fluorinated alcohol B may each be contained singly or in combination of two or more in the composition of the present invention.

Fluorinated Alcohol

The fluorinated alcohol is a compound in which one or more hydrogen atoms other than the hydrogen atom constituting a hydroxyl group are substituted with fluorine atoms in an alcohol, and represented by the above-described the formula (1).

In the fluorinated alcohol A, nF is preferably an integer of 1 to 10, more preferably an integer of 2 to 8, since excellent viscosity is obtained.

In the fluorinated alcohol B, nF is preferably an integer of 4 to 10, more preferably an integer of 5 to 8, since drying of the composition of the present invention can be suppressed.

It is particularly preferable that nF satisfies the above-described preferable ranges in both the fluorinated alcohol A and the fluorinated alcohol B.

In the fluorinated alcohol A and the fluorinated alcohol B, mF is preferably an integer of 4 to 12, more preferably an integer of 6 to 12, further preferably an integer of 8 to 12, since the composition of the present invention is excellent in film formability.

It is particularly preferable that mF satisfies the above-described preferable ranges in both the fluorinated alcohol A and the fluorinated alcohol B.

In the fluorinated alcohol A and the fluorinated alcohol B, nF and mF preferably satisfy $2 \leq 2nF+1-mF \leq 10$, more preferably satisfy $2 \leq 2nF+1-mF \leq 6$, further preferably satisfy $3 \leq 2nF+1-mF \leq 6$, particularly preferably satisfy $2nF+1-mF=3$.

The fluorinated alcohol represented by the formula (1) includes primary alcohols, secondary alcohols and tertiary alcohols, and preferable are primary alcohols.

The fluorinated alcohol represented by the formula (1) may be a linear alcohol (i.e., alcohol having a linear structure) or a branched alcohol (i.e., alcohol having a branched structure), and is preferably a linear alcohol and since it is easy to obtain the fluorinated alcohol represented by the formula (1). That is, it is preferable that both the fluorinated alcohol A and the fluorinated alcohol B are each a linear alcohol.

The fluorinated alcohol A includes, for example, 1H,1H-trifluoroethanol (boiling point: 74 to 75° C.) 1H,1H-pentafluoropropanol (boiling point: 81 to 83° C.) 1H,1H-heptafluorobutanol (boiling point: 95° C.) 2-(perfluorobutyl) ethanol (boiling point: 140 to 143° C.), 1H,1H,3H-tetrafluoropropanol (boiling point: 109 to 110° C.), 1H,1H, 5H-octafluoropentanol (boiling point: 140 to 141° C.)

2H-hexafluoro2-propanol (boiling point: 58.6° C.) and 1H,1H,3H-hexafluorobutanol (boiling point: 108 to 113° C.)

The fluorinated alcohol B includes, for example, 6-(perfluoroethyl)hexanol (boiling point: 173° C.) 3-(perfluorobutyl)propanol (boiling point: 179 to 182° C.), 6-(perfluorobutyl)hexanol (boiling point: 203 to 210° C.), 2-(perfluorohexyl)ethanol (boiling point: 195 to 200° C.) 3-(perfluorohexyl)propanol (boiling point: 208° C.) 6-(perfluorohexyl)hexanol (boiling point: 250 to 253° C.), 6-(perfluorol-methylethyl)hexanol (boiling point: 155 to 156° C.) and 1H,1H,7H-dodecafluoroneptanol (boiling point: 169 to 170° C.)

The fluorinated alcohol A has a boiling point of Preferably 80° C. to 145° C., more preferably 90° C. to 145° C., further preferably 110° C. to 145° C., particularly preferably 135° C. to 145° C., since the viscosity of the composition of the present invention can be reduced and the composition is more excellent in dischargeability by an ink jet method.

The fluorinated alcohol B has a boiling point of preferably 160° C. to 300° C., more preferably 165° C. to 250° C., further preferably 165° C. to 200° C., particularly preferably 165° C. to 185° C., since the composition of the present invention is less likely to cause clogging of an ink jet apparatus and is more excellent in dischargeability by an ink jet method.

A difference in the boiling point between the fluorinated alcohol A and the fluorinated alcohol B is preferably 50° C. or less, more preferably 5° C. to 45° C., more preferably 10° C. to 40° C., further preferably 20° C. to 35° C., particularly preferably 25° C. to 35° C.

The ratio of the fluorinated alcohol B contained in the composition of the present invention is preferably 20 parts by mass to 80 parts by mass, more preferably 30 parts by mass to 70 parts by mass with respect to 100 parts by mass of the sum of the fluorinated alcohol A and the fluorinated alcohol B, since the composition of the present invention is less likely to cause clogging of an ink jet apparatus and is more excellent in dischargeability by an ink jet method.

(Charge Transportable Compound)

The charge transportable compound includes, for example, aromatic hydrocarbon compounds typified by phenylene and derivatives thereof, naphthalene and derivatives thereof, anthracene and derivatives thereof, phenanthrene and derivatives thereof, dihydrophenanthrene and derivatives thereof, naphthacene and derivatives thereof, fluorene and derivatives thereof, pyrene and derivatives thereof, perylene and derivatives thereof, chrysene and derivatives thereof, and polymer compounds containing constitutional units derived from them;

aromatic heterocyclic compounds typified by oxadiazole and derivatives thereof, thiadiazole and derivatives thereof, thiazole and derivatives thereof, oxazole and derivatives thereof, thiophene and derivatives thereof, pyrrole and derivatives thereof, phosphole and derivatives thereof, furan and derivatives thereof, pyridine and derivatives thereof, pyrazine and derivatives thereof, pyrimidine and derivatives thereof, triazine and derivatives thereof, pyridazine and derivatives thereof, quinoline and derivatives thereof, isoquinoline and derivatives thereof, azole and derivatives thereof, diazole and derivatives thereof, triazole and derivatives thereof, carbazole and derivatives thereof, azacarbazole and derivatives thereof, diazacarbazole and derivatives thereof, dibenzophosphole and derivatives thereof, phenoxazine and derivatives thereof, phenothiazine and derivatives thereof, dibenzoborole and derivatives thereof, dibenzosilole and derivatives thereof, benzopyran and derivatives thereof and the like, and polymer compounds containing constitutional units derived from them;

organic silane compounds and polymer compounds containing constitutional units derived from them;

alkali metal salts and alkaline earth metal salts or aromatic hydrocarbon compounds, alkali metal salts and alkaline earth metal salts of aromatic heterocyclic compounds and alkali metal salts and alkaline earth metal salts of organic silane compounds;

halides, oxide salts and carbonates of alkali metals and halides, oxide salts and carbonates of alkaline earth metals;

and metal complexes.

Of them, preferable are aromatic hydrocarbon compounds, aromatic heterocyclic compounds, alkali metal salts or alkaline earth metal salts of aromatic hydrocarbon compounds, or alkali metal salts or alkaline earth metal salts of aromatic heterocyclic compounds, and since a light emitting device obtained by using the composition of the present invention is excellent in luminance life, more preferable are alkali metal salts or alkaline earth metal salts of aromatic hydrocarbon compounds, or alkali metal salts or alkaline earth metal salts of aromatic heterocyclic compounds, further preferable are alkali metal salts or alkaline earth metal salts constituted of a carboxylic acid ion in aromatic hydrocarbon compounds and an alkali metal ion or an alkaline earth metal ion, or alkali metal salts or alkaline earth metal salts constituted of a carboxylic acid ion in aromatic heterocyclic compounds and an alkali metal ion or an alkaline earth metal.

The charge transportable compound may be contained singly or in combination of two or more in the composition of the present invention.

When the charge transportable compound is a polymer compound, the polymer compound is preferably a polymer compound containing a constitutional unit represented by the formula (ET-1) or polyaniline, more preferably a polymer compound containing a polymer compound represented by the formula (ET-1). The constitutional unit represented by the formula (ET-1) may be contained singly or in combination of two or more in the polymer compound.

[Chemical Formula 14]

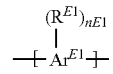

(ET-1)

[wherein, nE1 represents an integer of 0 or more.

$Ar^{E1}$ represents an aromatic hydrocarbon group or a heterocyclic group, and these groups optionally have a substituent other than $R^{E1}$.

$R^{E1}$ represents a group represented by the formula (ES-1). When a plurality of $R^{E1}$ are present, they may be the same or different.]

$$—R^{E2}-\{(Q^{E1})_{nF2}-Y^{E1}(M^{E1})_{aE1}(Z^{E1})_{bE1}\}_{mE1}$$ (ES-1)

[wherein, nE2 represents an integer of 0 or more, aE1 represents an integer of 1 or more, bE1 represents an integer of 0 or more, and mE1 represents an integer of 1 or more. When a plurality of nE2, aE1 and bE1 are present, they may be the same or different at each occurrence. When $RE^2$ is a single bond, mE1 is 1. In addition, aE1 and bE1 are selected so that the charge of a group represented by the formula (ES-1) is 0.

$R^{E2}$ represents a single bond, a hydrocarbon group, a heterocyclic group or —O—$R^{E2'}$ ($R^{E2'}$ represents a hydrocarbon group or a heterocyclic group.), and these groups optionally have a substituent.

$Q^{E1}$ represents an alkylene group, a cycloalkylene group, an arylene group, an oxygen atom or a sulfur atom, and these groups optionally have a substituent. When a plurality of $Q^{E1}$ are present, they may be the same or different.

$Y^{E1}$ represents —$CO_2^-$, —$SO_3^-$, —$SO_2^-$ or $PO_3^{2-}$. When a plurality of $Y^{E1}$ are, they may be the same or different.

$M^{E1}$ represents an alkali metal cation, an alkaline earth metal cation or an ammonium cation, and this ammonium cation optionally has a substituent. When a plurality of $M^{E1}$ are present, they may be the same or different.

$Z^{E1}$ represents $F^-$, $Cl^-$, $Br^-$, $I^-$, $OH^-$, $B(R^{E4})_4^-$, $R^{E4}SO_3^-$, $R^{E4}COO^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$. $R^{E4}$ represents an alkyl group, a cycloalkyl group or an aryl group, and these groups optionally have a substituent. When a plurality of $Z^{E1}$ are present, they may be the same or different.]

The "hydrocarbon group" denotes an atomic group remaining after removing one or hydrogen atoms from a hydrocarbon.

The "aromatic hydrocarbon group" denotes an atomic group remaining after removing one or more hydrogen atoms from an aromatic compound, among "hydrocarbon groups".

nE1 is, for example, an integer of 0 to 4, preferably 1 or 2.

As the aromatic hydrocarbon group or the heterocyclic group represented by $Ar^{E1}$, preferable is a group obtained by removing from a 1,4-phenylene group, a 1,3-phenylene group, a 1,2-phenylene group, a 2,6-naphthalenediyl group, a 1,4-naphthalenediyl group, a 2,7-fluorenediyl group, a 3,6-fluorenediyl group, a 2,7-phenanthrenediyl group, a 2,7-carbazolediyl group or a thiophenediyl group nE1 hydrogen atoms bonding directly to atoms constituting the ring, more preferable is a group obtained by removing from a 2,7-fluorenediyl group or a 3,6-fluorenediyl group nE1 hydrogen atoms bonding directly to atoms constituting the ring, and a substituent other than $R^{E1}$ may be carried.

The substituent other than $R^{E1}$ which $Ar^{E1}$ optionally has includes, for example, a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkynyl group, a cycloalkenyl group, an alkynyl group, a cycloalkynyl group, a carboxyl group and a group represented by the formula (ES-3), preferably an alkyl group.

—O—$(C_{n'}H_{2n'}O)_{nx}$-$C_{m'}H_{2m'+1}$  (ES-3)

[wherein, n', m' and nx each independently represent an integer of 1 or more.]

n' is, for example, an integer of 1 to 10, preferably an integer of 1 to 6, more preferably 2 or 3.

m' is, for example, an integer of 1 to 10, preferably an integer of 1 to 6, more preferably 1 or 2.

Nx is, for example, an integer of 1 to 10, preferably an integer of 1 to 6, more preferably an integer of 2 to 4.

nE2 is, for example, an integer of 0 to 10, preferably an integer of 0 to 8, more preferably an integer of 0 to 2.

aE1 is, for example, an integer of 1 to 10, preferably an integer of 1 to 5, more preferably 1 or 2.

bE1 is, for example, an integer of 0 to 10, preferably an integer of 0 to 4, more preferably 0 or mE1 is, for example, an integer of 1 to 5, preferably 1 or 2, more preferably 1.

When $R^{E2}$ is —O—$R^{E2'}$, the group represented by the formula (ES-1) is a group represented by the following formula.

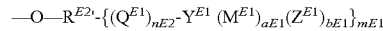
—O—$R^{E2'}$-{($Q^{E1})_{nE2}$-$Y^{E1}$ $(M^{E1})_{aE1}(Z^{E1})_{bE1}\}_{mE1}$ $R^{E2}$ is preferably a hydrocarbon group or a heterocyclic group, more preferably an aromatic hydrocarbon group or an aromatic heterocyclic group, further preferably an aromatic hydrocarbon group.

The substituent which $R^{32}$ optionally has includes an alkyl group, a cycloalkyl group, an aryl group, a monovalent heterocyclic group and a group resented by the formula (ES-3), preferably a group represented by the formula (ES-3).

$Q^{E1}$ is preferably an alkylene group, an arylene group or an oxygen atom, more preferably an alkylene group or an oxygen atom.

$Y^{E1}$ is preferably —$CO_2^-$, —$SO_3^-$ or $PO_3^{2-}$, more preferably —$CO_2^-$.

The alkali metal cation represented by $M^{E1}$ includes, for example, $Li^+$, $Na^+$, $K^+$, $Rb^+$ and $Cs^+$, Preferably $K^+$, $Rb^+$ or $Cs^+$, more preferably $Cs^+$.

The alkaline earth metal cation represented by. $M^{E1}$ includes, for example, $Be^{2+}$, $Mg^{2+}$, $Ca^{2+}$, $Sr^{2+}$ and $Ba^{2+}$, preferably $Mg^{2+}$, $Ca^{2+}$, $Sr^{2+}$ or $Ba^{2+}$, more preferably $Ba^{2+}$.

$M^{E1}$ is preferably an alkali metal cation or an alkaline earth metal cation, more preferably an alkali metal cation.

$Z^{E1}$ is preferably $F^-$, $Cl^-$, $Br^-$, $I^-$, $OH^-$, B $(R^{E4})_4^-$, $R^{E4}SO_3^-$, $R^{E4}COO^-$ or $NO_3^-$, more preferably $F^-$, $Cl^-$, $Br^-$, $I^-$, $OH^-$, $R^{E4}SO_3^-$ or $R^{E4}COO^-$. $R^{E4}$ is preferably an alkyl group.

The group represented by the formula (ES-1) includes, for example, groups represented by the following formulae.

[Chemical Formula 15]

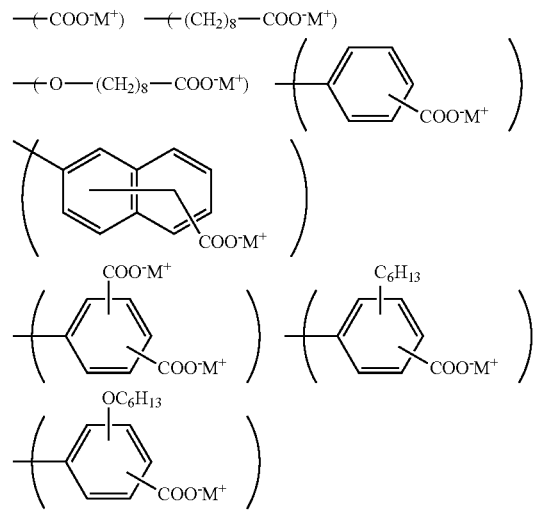

[Chemical Formula 16]

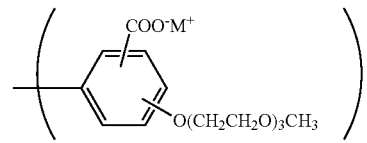

-continued

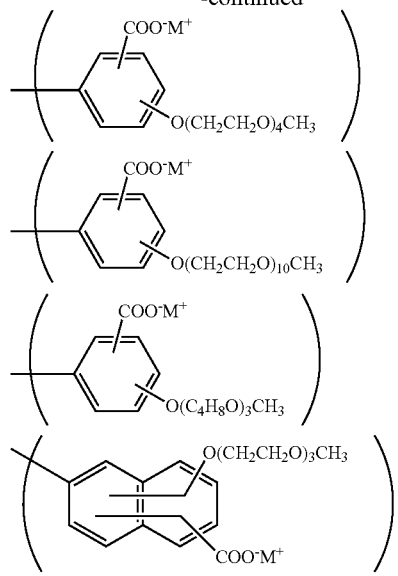

[Chemical Formula 17]

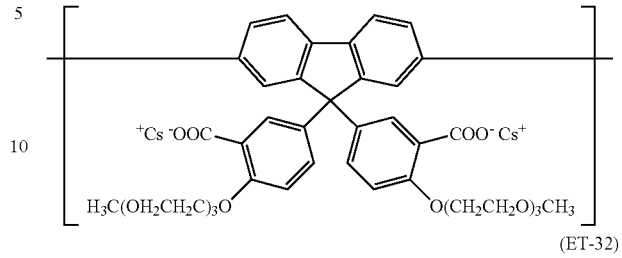

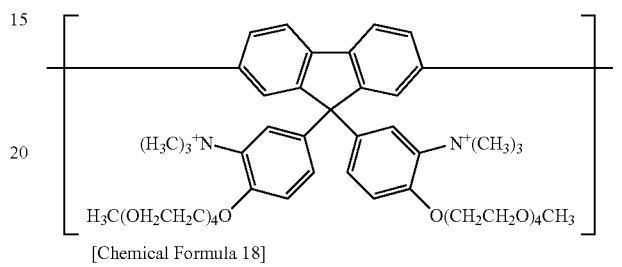

[Chemical Formula 18]

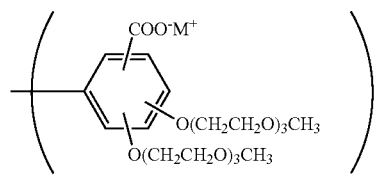

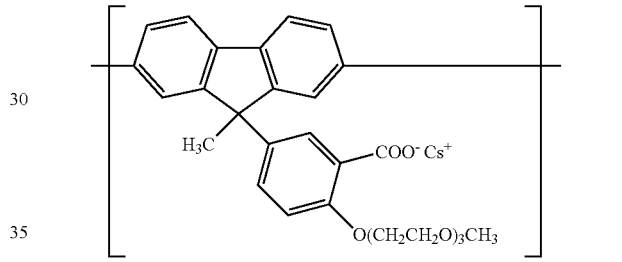

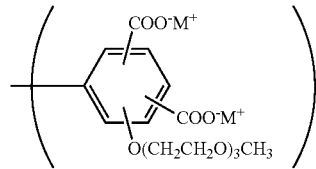

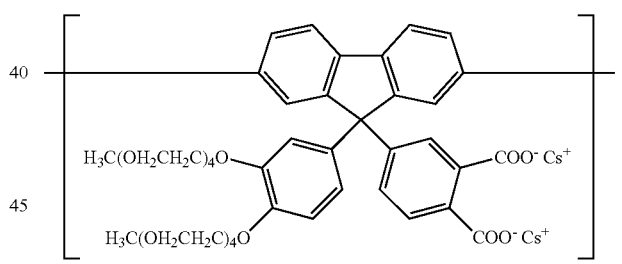

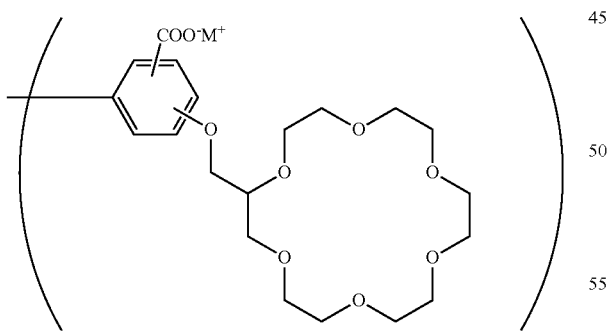

[Chemical Formula 19]

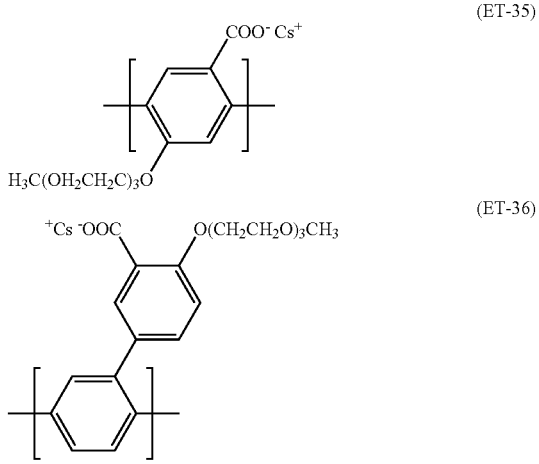

[wherein, $M^+$ represents $Li^+$, $Na^+$, $K^+$, $Cs^+$ or $N(CH_3)_4{}^+$. When a plurality of $M^+$ are present, they may be the same or different.]

The constitutional unit represented by the formula (ET-1) includes, for example, constitutional units represented by the formula (ET-31) to the formula (ET-38), preferably constitutional units represented by the formula (ET-31) or the formula (ET-33).

-continued

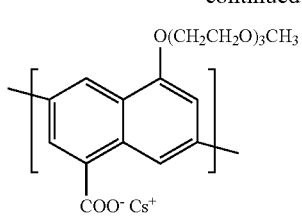
(ET-37)

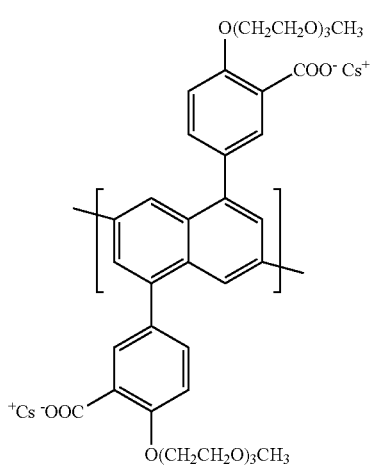
(ET-38)

When the charge transportable compound is a polymer compound, the polymer compound can be synthesized in accordance with methods described, for example, in Unexamined Japanese Patent Application Publication (JP-A) No. 2009-239279, JP-A No. 2012-033845, JP-A No. 2012-216821, JP-A No. 2012-216822 and JP-A. No. 2012-216815.

When the charge transportable compound is a low molecular compound, the low molecular compound is preferably a compound represented by the formula (H-1).

[Chemical Formula 20]

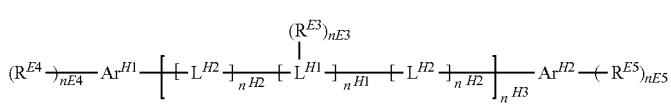
(H-1)

wherein, $n^{H3}$ represents an integer of 0 or more.

$n^{H1}$ represents 0 or 1. When a plurality of $n^{H1}$ are present, they may be the same or different.

$n^{H2}$ represents 0 or 1. A plurality of $n^{H2}$ may be the same or different.

$L^{H1}$ represents a group obtained by removing nE3 hydrogen atoms from an arylene group or a divalent heterocyclic group, a group represented by $-[C(R^{H11})_2]n^{H11}-$ or a group represented by $-[P(=O)(R^{H12})]n^{H12}-$ and these groups optionally have a substituent other than $R^{E2}$. When a plurality of $L^{H1}$ are present, they may be the same or different.

$n^{H11}$ and $n^{H12}$ each independently represent an integer of 1 to 10. $R^{H11}$ and $R^{H12}$ each independently represent a hydrogen atom, an alkyl group, a cycloalkyl group, an alkoxy group, a cycloalkoxy group, an aryl group or a monovalent heterocyclic group, and these groups optionally have a substituent. A plurality of $R^{H11}$ may be the same or different and may be combined together to form a ring together with carbon atoms to which they are attached. A plurality of $R^{H12}$ may be the same or different and may be combined together to form a ring together with carbon atoms to which they are attached.

nE3 represents an integer of 0 or more. nE3 represents 0 when $L^{H1}$ represents a group represented by $-[C(R^{H11})_2]n^{H11}-$ or a group represented by $-[P(=O)(R^{H2})]n^{H12}$. When a plurality of nE3 are present, they may be the same or different.

$R^{E3}$ represents a group represented by the formula (ES-1) described above. When a plurality of $R^{E3}$ are present, they may be the same or different.

$L^{H2}$ represents a group represented by $-N(-L^{H21}-R^{H21})-$. When a plurality of $L^{H2}$ are present, they may be the same or different.

$L^{H21}$ represents a single bond, an arylene group or a divalent heterocyclic group, and these groups optionally have a substituent. $R^{H21}$ represents a hydrogen atom, an alkyl group, a cycloalkyl group, an aryl group or a monovalent heterocyclic group, and these groups optionally have a substituent.

$Ar^{H1}$ represents a group obtained by removing nE4 hydrogen atoms from an aryl group or a monovalent heterocyclic group, and these groups optionally have a substituent other than $R^{E4}$.

$Ar^{H2}$ represents a group obtained by removing nE5 hydrogen atoms from an aryl group or a monovalent heterocyclic group, and these groups optionally have a substituent other than $R^{E5}$.

$n^{E4}$ and $n^{E5}$ each independently represent an integer of 0 or more.

$R^{E4}$ and $R^{E5}$ each independently represent a group represented by the formula (ES-1) described above. A plurality of $R^{E4}$ may be the same or different. A plurality of $R^{E3}$ may be the same or different.]

$n^{H3}$ is for example an integer of 0 or more and 10 or less, preferably an integer of 0 or more and 5 or less, further preferably an integer of 1 or more and 3 or less, particularly preferably 1.

$n^{H1}$ is preferably 1.

$n^{H2}$ is preferably 0.

$n^{H11}$ is preferably an integer of 1 or more and 5 or less, more preferably an integer of 1 or more and 3 or less, further preferably 1.

$n^{H12}$ is preferably an integer of 1 or more and 5 or less, more preferably an integer of 1 or more and or less, further preferably 1.

$L^{H1}$ is preferably a group obtained by removing nE3 hydrogen atoms from an arylene group or a divalent heterocyclic group from the standpoint of the charge transportability of a low molecular compound, and preferably a group represented by $-[P(=O)(R^{H12})]n^{H12}-$ from the standpoint of solubility in a fluorinated alcohol.

When $L^{H1}$ is a group obtained by removing nE3 hydrogen atoms from an arylene group or a divalent heterocyclic group, $L^{H1}$ is preferably a group obtained by removing nE3 hydrogen atoms from a group represented by the formula (A-1) to the formula (A-3), the formula (A-8) to the formula (A-10), the formula (AA-1) to the formula (AA-6), the formula (AA-10) to the formula (AA-21) or the formula (AA-24) to the formula (AA-38), more preferably a group obtained by removing nE3 hydrogen atoms from a group represented by the formula (A-1), the formula (A-2), the formula (AA-2), the formula (AA-4) or the formula (AA-14).

The substituent which $L^{H1}$ optionally has is a halogen atom, an alkyl group, a cycloalkyl group, an alkoxy group, a cycloalkoxy group, an aryl group or a monovalent heterocyclic group, more preferably an alkyl group, an aryl group or a monovalent heterocyclic group, and these groups optionally further have a substituent.

$L^{H21}$ is preferably a single bond or an arylene group, more preferably a single bond, and this arylene group optionally has a substituent.

The arylene group or the divalent heterocyclic group represented by $L^{H21}$ is preferably a group represented by the formula (A-1) to the formula (A-3), the formula (A-8) to the formula (A-10), the formula (AA-1) to the formula (AA-6), the formula (AA-10) to the formula (AA-21) or the formula (AA-24) to the formula (AA 38), more preferably a group represented by the formula (A-1), the formula (A-2), the formula (AA-2), the formula (AA-4) or the formula (AA-14).

$R^{H21}$ is preferably an aryl group or a monovalent heterocyclic group, and these groups optionally have a substituent.

The aryl group or the monovalent heterocyclic group represented by $R^{H21}$ is preferably a phenyl group, a spirobifluorenyl group, a pyridyl group, a pyrimidinyl group, a triazinyl group, a dibenzothienyl group, a dibenzofuryl group, a carbazolyl group or an azacarhazolyl group, more preferably a phenyl group, a pyridyl group, a carbazolyl group or an azacarhazolyl group.

The substituent which $R^{H21}$ optionally has is preferably an alkyl group, a cycloalkoxy group, an alkoxy group or a cycloalkoxy group, an alkyl group or a cycloalkoxy group, and these groups optionally further have a substituent.

The group obtained by removing nE4 hydrogen atoms from an aryl group or a monovalent heterocyclic group represented by $Ar^{H1}$ is preferably a group obtained by removing nE4 hydrogen atoms from a phenyl group, a spirobifluorenyl group, a pyridyl group, a pyrimidinyl group, a triazinyl group, a dibenzothienyl group, a dibenzofuryl group, a carbazolyl group or an azacarhazolyl group, more preferably a group obtained by removing nE4 hydrogen atoms from a phenyl group, a pyridyl group, a carbazolyl group or an azacarhazolyl group.

The group obtained by removing nE5 hydrogen atoms from an aryl group or a monovalent heterocyclic group represented by $Ar^{H2}$ is preferably a group obtained by removing nE5 hydrogen atoms from a phenyl group, a spirobifluorenyl group, a pyridyl group, a pyrimidinyl group, a triazinyl group, a dibenzothienyl group, a dibenzofuryl;l group, a carbazolyl group or an azacarhazolyl group, more preferably a group obtained by removing nE5 hydrogen atoms from a phenyl group, a pyridyl group, a carbazolyl group or an azacarhazolyl group.

The definitions and examples of the substituent which $Ar^{H1}$ and $Ar^{H2}$ optionally have are the same as the definitions and examples of the substituent which $R^{H21}$ optionally has.

The compound represented by the formula (H-1) is preferably a compound represented by the formula (H-2).

[Chemical Formula 21]

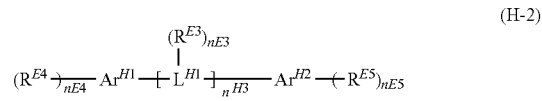

(H-2)

[wherein, $n^{H3}$, $L^{H1}$, nE3, $R^{E3}$, $Ar^{H1}$, $Ar^{H2}$, nE4, nE5, $R^{E4}$ and $R^{E5}$ represent the same meaning as described. above.]

It is preferable that at least one of nE3, nE4 and nE5 is an integer of 1 or more.

As the compound represented by the formula (H-1), exemplified are compounds represented by the formula (H-101) to the formula. (H-116).

[Chemical Formula 22]

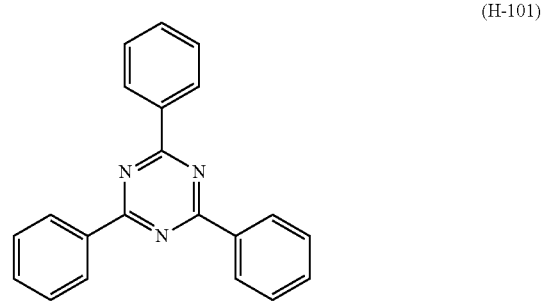

(H-101)

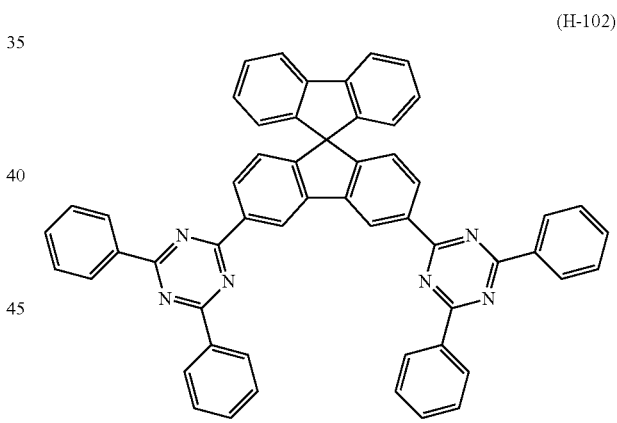

(H-102)

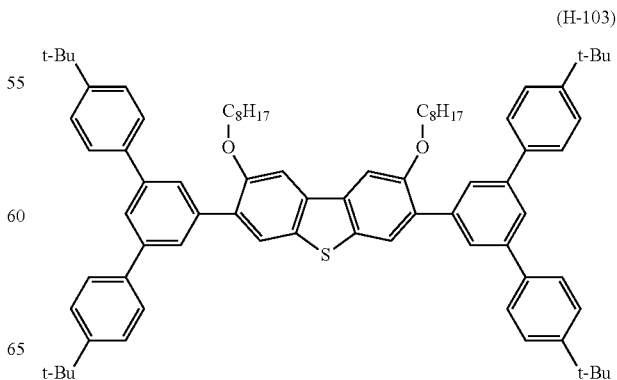

(H-103)

(H-104)
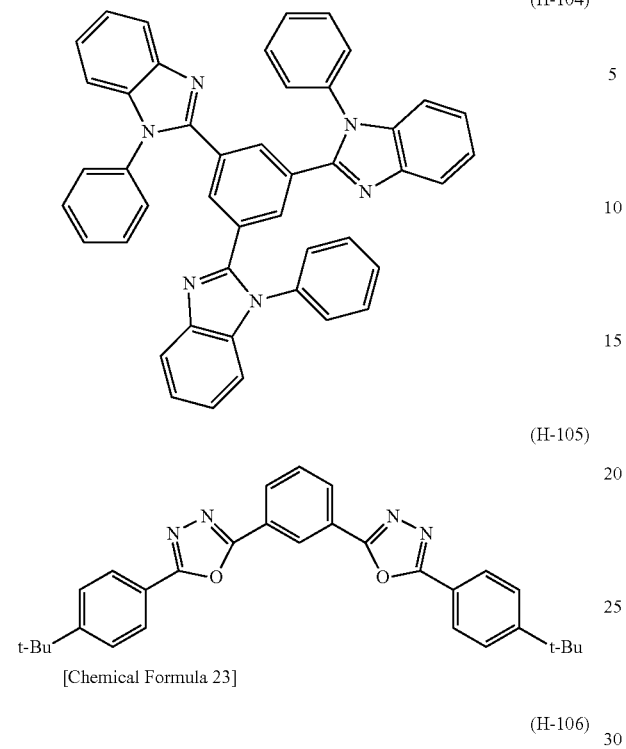
[Chemical Formula 23]
(H-105)
(H-106)
(H-107)
[Chemical Formula 24]
(H-108)
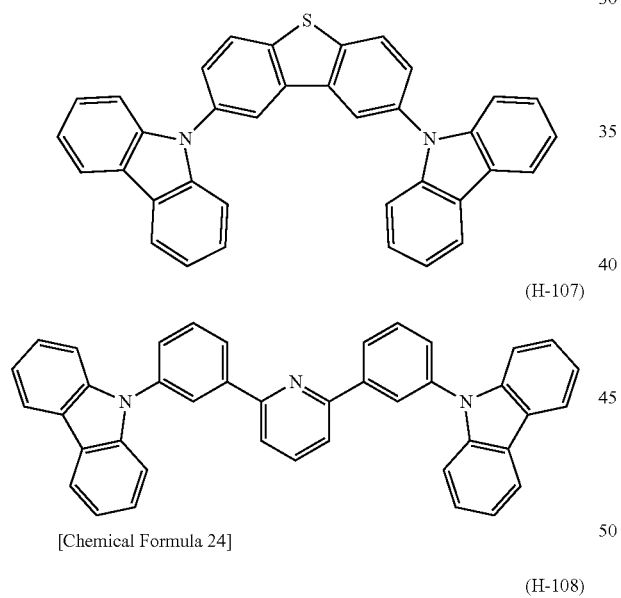
(H-109)
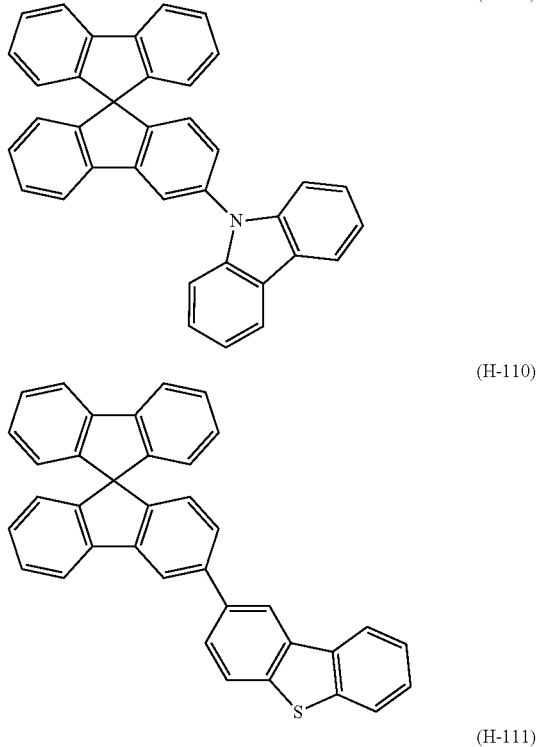
(H-110)
(H-111)
[Chemical Formula 25]
(H-112)
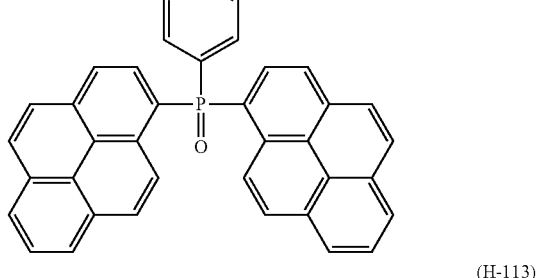
(H-113)
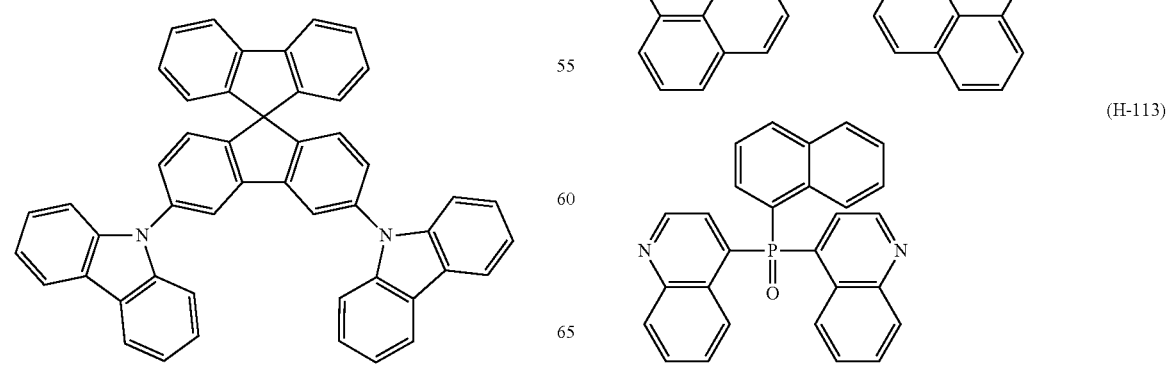

-continued (H-114)

(H-115)

[Chemical Formula 26]

(H-116)

[wherein, M⁺ represents $Li^+$, $Na^+$, $K^+$, $Cs^+$ or $N(CH_3)_4^+$. When a plurality of M⁺ are present, they may be the same or different.]

The ratio of the charge transportable compound contained in the composition of the present invention is preferably 0.01 parts by mass to 10 parts by mass, more preferably 0.05 parts by mass to 5 parts by mass, further preferably 0.05 parts by mass to 2 parts by mass with respect to 100 parts by mass of the composition, since dischargeability in an ink jet method is more excellent.

The charge transportable compound contained in the composition of the present invention is preferably a polymer compound from the standpoint of the flatness of a film formed by using the composition of the present invention, and preferably a low molecular compound from the standpoint of dischargeability in an ink let method.

The composition of the present invention may contain optional components other than the fluorinated alcohol A, the fluorinated alcohol B and the charge transportable compound.

The optional components include a solvent having surface tension higher than that of the fluorinated alcohol A and the fluorinated alcohol B and having a boiling point higher than that of the fluorinated alcohol A and the fluorinated alcohol B (hereinafter, referred to also as "solvent C"), and water.

The solvent C may be contained singly or in combination of two or more in the composition of the present invention.

It is preferable that the composition of the present invention further contains the solvent C as an optional component since shrink in forming a film of the composition (that is, a phenomenon in which when a film formed by applying the composition is dried, the film shrinks, and the area of the film after drying becomes smaller than the area of the film before drying) can be suppressed.

A difference between the highest surface tension of the fluorinated alcohol A and the fluorinated alcohol B and the lowest surface tension of the solvent C is preferably 10 mN/m to 70 mN/m, more preferably 15 mN/m to 70 mN/m, further preferably 20 mN/m to 65 mN/m.

A difference between the highest boiling point of the fluorinated alcohol B and the lowest boiling point of the solvent C is preferably 5° C. to 50° C., more preferably 10° C. to 40° C.

The solvent C includes, for example, chlorine solvents such as o-dichlorobenzene and the like; ether solvents such as anisole, 4-methylanisole and the like; aromatic hydrocarbon solvents such as mesitylene, n-hexylbenzene, cyclohexylbenzene and the like; aliphatic hydrocarbon solvents such as n-nonane, n-decane, n-dodecane, bicyclohexyl and the like; ketone solvents such as cyclohexanone, acetophenone and the like; ester solvents such as ethylcellosolve acetate, methyl benzoate, phenyl acetate and the like; poly-hydric alcohol solvents such as glycerin and the like; non-fluorinated alcohol solvents such as cyclohexanol and the like, diol solvents such as ethylene glycol, 1,2-propanediol, 1,3-propanediol, 1,4-butanediol and the like; alkoxy alcohol solvents such as ethylcarbitol, methylcarbitol and the like; fluorinated diol solvents such as 2,2,3,3,4,4,5,5-octafluoro-1,6-hexanediol and the like; sulfoxide solvents such as dimethyl sulfoxide and the like; amide solvents such as N-methyl-2-pyrrolidone, N,N-dimethylformamide and the like; carboxylic acid type solvents such as butanoic acid and the like; and nitrile solvents such as hexanenitrile and the like.

Of them, ketone solvents, ester solvents, non-fluorinated alcohol solvents, diol solvents, fluorinated diol solvents, sulfoxide solvents, amide solvents or carboxylic acid solvents are preferable, ester solvents, non-fluorinated alcohol solvents, diol solvents or fluorinated dial solvents are more preferable, fluorinated dial solvents or diol solvents are further preferable, since affinity with the fluorinated alcohol A and the fluorinated alcohol B is good.

The ratio rate of the solvent C contained in the composition of the present invention is preferably 0.1 part by mass to 20 parts by mass, more preferably 0.5 parts by mass to 10 parts by mass with respect to 100 parts by mass of the composition, since wettability is excellent when applying the composition to form a film.

It is preferable that the composition of the present invention further contains water as an optional component, since the viscosity of the composition can be decreased.

The ratio of water contained in the composition of the present invention is preferably 0.5 parts by mass to 10 parts by mass, more preferably 1 part by mass to 5 parts by mass with respect to 100 parts by mass of the composition, since the viscosity of the composition can be decreased and uniformity of the composition can be kept.

<Production Method of Film>

The production method of a film of the present invention comprises a step of forming a film by an application method using the composition of the present invention.

The application method includes, for example, a spin coat method, a casting method, a gravure printing method, a bar coat method, a slit coat method, an ink jet method and a nozzle coat method, preferably an ink jet method.

The thickness of a film produced by the production method of the present invention is usually 1 nm to 1 μm.

<Production Method of Light Emitting Device>

The production method of a light emitting device of the present invention comprises a step of forming a layer by an application method using the composition of the present invention.

The production method of a light emitting device of the present invention usually comprises a step of forming a light emitting layer and a step of forming a layer by an application method using the composition of the present invention. The layer formed by an application method using the composition of the present invention is preferably' at least one layer selected from the group consisting of a hole injection layer, a hole transporting layer, an electron injection layer and an electron transporting layer, more preferably at least one layer selected from the group consisting of an electron injection layer and an electron transporting layer.

The application method includes, for example, a spin coat method, a casting method, a gravure printing method, a bar coat method, a slit coat method, an ink jet method and a nozzle coat method, preferably an ink jet method.

When forming a layer by an ink jet method using the composition of the present invention in the production method of a light emitting device of the present invention, the nozzle of an ink jet apparatus may be one which can supply the composition of the present invention in the form of fine liquid drops. By adopting an ink jet method, a film having a desired pattern can be formed easily without post treatment step, thus, productivity is very excellent from the standpoint of time and cost, and an extremely correct pattern can be formed.

The size of the liquid drop of the composition supplied from an injection nozzle of an ink jet apparatus depends on the tube diameter of the nozzle (inner diameter), the viscosity and surface tension of the composition, and the supply speed of the composition and the like, and it is preferable that the maximum diameter is 2000 μm or less.

The speed of the composition supplied to the surface of a substrate from injection nozzles of an ink jet apparatus is preferably 1 pl/min to 10 ml/min per one injection nozzle. By adjusting the supply speed of the composition, the thickness of the resulting film can be controlled.

The supply of the composition from injection nozzles of an ink jet apparatus is usually conducted in so-called pulse supply mode in which discharge (injection) is repeated at a constant interval. In the pulse supply, the pulse width is preferably 1 μs to 1 ms, more preferably 20 μs to 50 μs, and the pulse interval is preferably 1 μs to 1 ms, more preferably 40 μs to 100 μs.

The light emitting device produced by the production method of the present invention usually has an anode, a cathode, a light emitting layer, and a layer formed by an application method using the composition of the present invention. The light emitting device produced by the production method of the present invention may further have a protective layer, a buffer layer, a reflection layer, a sealing layer, an insulation layer and the like.

In the production method of a light emitting device of the present invention, when a low molecular compound is used, the method for forming each layer includes, for example, a vacuum vapor-deposition method from a powder and a method by film formation from solution or melted state, and when a polymer compound is used, the method includes, for example, a method by film formation from solution or melted state (application methods such as, for example, a spin coat method, a casting method, a gravure method, a bar coat method, a slit coat method, an ink let method, a nozzle coat method and the like). The method for forming each layer is preferably a method by film formation from a solution, among them.

The order, number and thickness of layers to be laminated may be adjusted in view of light emission efficiency and device life.

[Substrate]

The substrate which the light emitting device produced by the production method of the present invention can have is one that does not chemically change in forming an electrode and an organic layer, and for example, is a substrate such as, for example, glass, plastic, polymer film, metal film, silicon and the like.

[Hole Injection Layer, Hole Transporting Layer]

The hole injection layer and the hole transporting foyer each can be formed, for example, by using one or two or more of the above-described charge transportable compound.

The hole injection layer and the hole transporting layer each has a thickness of, for example, 1 nm to 1 μm.

[Light Emitting Layer]

The light emitting layer can be formed by using a light emitting material. The light emitting materials are classified into low molecular compounds and polymer compounds.

The low molecular compound includes, for example, naphthalene and derivatives thereof, anthracene and derivatives thereof, perylene and derivatives thereof, and triplet light emitting complexes such as metal complexes having iridium, platinum or europium as the central metal and having phenylpyridine, phenylimidazole, phenyltriazole, phenylquinoline, phenanthroline, acetylacetone, porphyrin or the like as the ligand. These low molecular compounds optionally have a crosslinking group.

The polymer compound includes, for example, polymer compounds containing a phenylene group, a naphthalenediyl group, a fluorenediyl group, a phenanthrenediyl group, a dihydrophenanthrenediyl group, a carbazolediyl group, a phenoxazinediyl group, a phenothiazinediyl group, an anthracenediyl group, a pyrenediyl group and the like, polyarylenes having an aromatic amine structure in the side chain or the main chain, and derivatives thereof. These polymer compounds optionally have a crosslinking group.

The light emitting material may be used alone or in combination of two or more.

The light emitting layer may be form using a light emitting material and a host material. The host materials are classified into low molecular compounds and polymer compounds.

The low molecular compound used in the host material includes, for example, compounds having a carbazole structure, compounds having a triarylamine structure, compounds having a phenanthroline structure, compounds having a triaryltriazine structure, compounds having an azole structure, compounds having a benzothiophene structure, compounds having a benzofuran structure, compounds having a fluorene structure and compounds having a spirobifluorene structure.

The polymer compound used in the host material includes polymer compounds containing one or more selected from the group consisting of arylene groups, divalent heterocyclic groups and divalent aromatic amine groups as constitutional units.

The thickness of the light emitting layer is, for example, 5 nm to 1 μm.

[Electron Injection Layer, Electron Transporting Layer]

The electron injection layer and the electron transporting layer each can be formed, for example, by using one or two or more of the above-described charge transportable compound.

The electron injection layer and the electron transporting layer each has a thickness of, for example, 1 nm to 1 μm.

[Anode]

The material of the anode may be, for example, an electrically conductive metal oxide or a semi-transparent metal, and is, preferably, indium oxide, zinc oxide, tin oxide; an electrically conductive compound such as indium-tin-oxide (ITO), indium-zinc-oxide or the like; argentine-palladium-copper composite (APC); NESA, gold, platinum, silver or copper.

As the method for fabricating the anode, known methods can be used, and examples thereof include a vacuum vapor-deposition method, a sputtering method, an ion plating method, a plating method, a method by film formation from a solution (a mixed solution with a polymer binder may also be used), and the like.

The anode has a thickness of, for example, 10 nm to 10 μm.

[Cathode]

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of one or more of them and one or more of silver, copper, manganese, titanium, cobalt, nickel, tungsten and tin; and graphite and graphite intercalation compounds.

As the method for fabricating the cathode, known methods can be used, and exemplified are a vacuum vapor-deposition method, a sputtering method, an ion plating method and a method by film formation from a solution (a mixed solution with a polymer binder may also be used). When the cathode is composed of metal nano particles, metal nano wires or electrically conductive metal oxide nano particles, a method by film formation from a solution is used.

The cathode has a thickness of, for example, 1 to 1000 nm.

[Application]

The light emitting device produced by the production method of the present invention can be suitably used as a display of computers, televisions, mobile terminals and the like, a planar light source for backlight of liquid crystal displays or a planar illumination light source. When a flexible substrate is used, it can be also used as a curved light source or display.

EXAMPLES

The present invention will be illustrated in detail by examples below, but the present invention is not limited to these examples.

In examples, the polystyrene-equivalent number-average molecular weight (Mn) and polystyrene-equivalent weight-average molecular weight (Mw) of a polymer compound were determined according to the measurement condition of size exclusion chromatography (SEC) described below using tetrahpdrofuran as a mobile phase.

<Measurement Condition>

A polymer compound to be measured was dissolved in tetrahydrofuran at a concentration of about 0.05% by mass, and 10 pL of the resultant solution was injected into SEC. The mobile phase was flowed at a flow rate of 1.0 mL/min. As a column, PLgel MIXED-B (manufactured by Polymer Laboratories, Ltd.) was used. As a detector, UV-VIS Detector (trade name: UV-8320 GPC, manufactured by Tosoh Corp.) was used.

NMR was measured by the following method

A measurement sample (5 to 10 mg) was dissolved in about 0.5 mL of heavy chloroform, heavy tetrahydrofuran, heavy dimethyl sulfoxide, heavy acetone, heavy N,N-dimethylformamide, heavy toluene, heavy methanol, heavy ethanol, heavy 2-propanol or heavy methylene chloride, and NMR thereof was measured using an NMR apparatus (trade name: INOVA300 or MERCURY400VX, manufactured by Agilent).

As an indicator of the purity of a compound, the value of high performance liquid chromatography (HPLC) area percentage was used. This value is a value at UV=254 nm in HPLC (trade name: LC-20A, manufactured by Shimadzu Corp.) unless otherwise stated. In this operation, a compound to be measured was dissolved in tetrahydrofuran or chloroform to a concentration of 0.01 to 0.2% by mass, and 1 to 10 μL of the solution was injected into HPLC depending on the concentration. As the mobile phase of HPLC, a mixture of acetonitrile/tetrahydrofuran was used while changing the ratio thereof from 100/0 to 0/100 (volume ratio) and flowed at a flow rate of 1.0 mL/min. As a column, Kaseisorb LC ODS 2000 (manufactured by Tokyo Chemical Industry Co., Ltd.) or an ODS column having the equivalent ability was used. As a detector, Photodiode Array Detector (trade name: SPD-M20A, manufactured by Shimadzu Corp.) was used.

The viscosity of the composition was measured using a viscosity measuring apparatus (manufactured by Brookfield, Inc., US, trade name: LVDV-II+Pro CP).

The dischargeability of the composition by an ink jet method and clogging of an ink jet apparatus were evaluated using an inkjet application apparatus (manufactured by Fujifilm Corp, trade name: Dymatics material printer, DMP-2831; cartridge: DMCLCP-11610).

Synthesis Example 1

Synthesis of Monomers CM1 and CM2

Monomers CM1 and CM2 were synthesized in accordance with methods described in the following documents, and those showing an HPLC area percentage value of 99.5% or more were adopted.

The monomer CMI was synthesized in accordance with a method described in JP-A. No. 2012-033845.

The monomer CM2 was synthesized in accordance with a method described in JP-A No. 2010-189630.

[Chemical Formula 27]

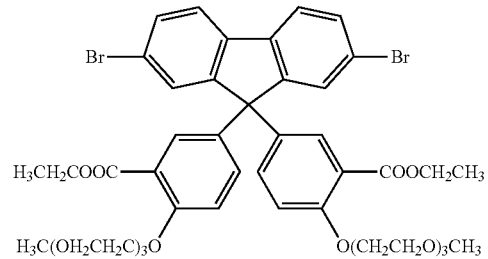

CM1

-continued

CM2

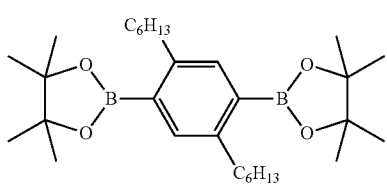

Synthesis Example 2

Synthesis of Polymer Compound 1

An inert gas atmosphere was prepared in a reaction vessel, then, the monomer CM1 (9.23g), the monomer CM2 (4.58 g), dichlorobis(tris-o-methoxyphenylphoshpine)palladium (8.6 mg) and toluene (175 mL) were added, and heated at 105° C.

Thereafter, into this was dropped a 12% by mass sodium carbonate aqueous solution (40.3 mL), and the mixture was refluxed for 29 hours.

Thereafter, to this were added phenylboronic acid (0.47 g) and dichlorobis(tris-o-methoxyphenylphosphine)palladium (8.7 mg), and the mixture was refluxed for 14 hours.

Then, to this was added a sodium diethyldithiacarbamate aqueous solution, and the mixture was stirred at 80° C. for 2 hours. The resultant reaction solution was cooled, then, dropped into methanol, to generate a precipitate. The resultant precipitate was isolated filtration, and washed with methanol and water respectively, then, dried, to obtain a solid. The resultant solid was dissolved in chloroform, and purified by passing sequentially through an alumina column and a silica gel column through which chloroform had passed previously. The resultant purified solution was dropped into methanol, and the mixture was stirred, to generate a precipitate. The resultant precipitate was isolated by filtration, and dried, to obtain a polymer compound P1 (7.15 g). The polymer compound P1 had an Mn of $3.2 \times 10^4$ and an Mw of $6.0 \times 10^4$.

The polymer compound P1 is a copolymer constituted of a constitutional unit derived from the monomer CM1 and a constitutional unit derived from the monomer CM2 at a molar ratio of 50:50 according to the theoretical values calculated from the amounts of the charged raw materials.

An argon gas atmosphere was prepared in a reaction vessel, then, the polymer compound P1 (3.1 g), tetrahydrofuran (130 mL), methanol (66 mL), cesium hydroxide monohydrate (2.1 g) and water (12.5 mL) were added, and stirred at 60° C. for 3 hours.

Thereafter, to this was added methanol (220 mL), and the mixture was stirred for 2 hours. The resultant reaction mixture was concentrated, then, dropped into isopropyl alcohol, and the mixture was stirred, to generate a precipitate. The resultant precipitate was isolated by filtration, and dried, to obtain a polymer compound 1 (3.5 g). By $^1$H NMR analysis of the polymer compound 1, it was confirmed that a signal of an ethyl ester portion in the polymer compound P1 disappeared and the reaction was completed.

The polymer compound 1 is a copolymer constituted of a constitutional unit represented by the following formula and a constitutional unit derived from the monomer CM2 at a molar ratio of 50:50 according to the theoretical values calculated from the amounts of the charged raw materials.

[Chemical Formula 28]

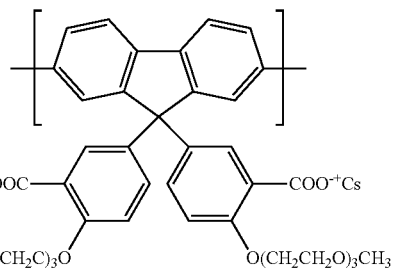

Example 1

Preparation of Composition 1

The polymer compound 1 was dissolved at a concentration of 0.05% by mass in a mixed solvent of 1H,1H,5H-octafluoropentanol (boiling point: 140 to 141° C., surface tension: 22.1 mN/m) and 1H,1H,7H-dodecafluoroheptanol (boiling point: 169 to 170° C., surface tension: 18.2 mN/m) (mass ratio 70:30), to prepare a composition 1 (viscosity: 0.0177 Pa·s)

Example 2

Preparation of Composition 2

A composition 2 (viscosity: 0.0221 Pa·s) was prepared in the same manner as in Example 1, except that the mass ratio of the mixed solvent was 50:50 in Example 1.

Example 3

Preparation of Composition 3

A composition 3 (viscosity: 0.0247 Pa·S) was prepared in the same manner as in Example 1, except that the mass ratio of the mixed solvent was 30:70 in Example 1.

Example 4

Preparation of Composition 4

A composition 4 (viscosity: 0.0111 Pa·S) was prepared in the same manner as in Example 1, except that the mixed solvent was changed to a mixed solvent of 1H,1H,5H-octafluoropentanol, 1H,1H,7H-dodecafluoroheptanol and water (mass ratio 27:70:3).

Example 5

Preparation of Composition 5

The polymer compound 2 (a polymer compound containing a constitutional unit represented by the formula (ET-1), $Ar^{E1}$ is a 2,7-fluorenediyl group, nE1 is 1) synthesized by the same method as for the polymer compound 1 was dissolved at a concentration of 0.2% by mass in a mixed solvent of 1H,1H,5H-octafluoropentanol and 1H,1H,7H-dodecafluoroheptanol (mass ratio 60:40), to prepare a composition 5 (viscosity: 0.020 Pa's).

Example 6

Preparation of Composition 6

A mixture (mass ratio 50:50) of the polymer compound 2 and the polymer compound 3 (a polymer compound containing a constitutional unit represented by the formula (E2-1), $Ar^{E1}$ is a 2,7-fluorenediyl group, nE1 is 1) synthesized by the same method as for the polymer compound 1 was dissolved at a concentration of 0.2% by mass in a mixed solvent of 1H,1H,5H-octafluoropentanol, 1H,1H,7H-dodecafluoroheptanol, propyrene glycol (boiling point: 188 to 189° C., surface tension 72.0 mN/m) and water (mass ratio 53:38.5:4.8:3.7), to prepare a composition 6 (viscosity: 0.016 Pa·s).

Comparative Example 1

Preparation of Composition C1

The polymer compound 1 was dissolved at a concentration of 0.05% by mass in 1H,1H,5H-octafluoropentanol, to prepare a composition C1 (viscosity: 0.0143 Pa·s).

Comparative Example 2

Preparation of Composition C2

The polymer compound 1 was dissolved at a concentration of 0.05% by mass in 1H,1H,7H-dodecafluoroheptanol, to prepare a composition C2 (viscosity: 0.0329 Pa·s).

Synthesis Example 3

Synthesis of Polymer Compound 4

The polymer compound 4 was synthesized in accordance with a method described in "Chemistry of Materials, 2004, vol. 16, p. 708". The polymer compound 4 had an Mn of $2.5 \times 10^3$ and an Mw of $3.1 \times 10^3$.

The polymer compound 4 is a polymer compound composed of a constitutional unit represented by the following formula.

[Chemical Formula 29]

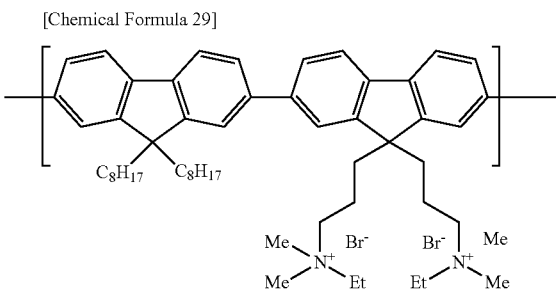

Example 7

Preparation of Composition 7

The polymer compound 1 was dissolved at a concentration of 0.05% by mass in a mixed solvent of 13,1H-pentafluoropropanol (boiling point: 81 to 83° C., surface tension: 17.3 mN/m) and 1H,1H,7H-dodecafluoroheptanol (mass ratio 60:40), to prepare a composition 7 (viscosity: 0.0090 Pa·s).

Example 8

Preparation of Composition 8

The polymer compound 4 was dissolved at a concentration of 0.05% by mass in a mixed solvent of 1H,1H,5H-octafluoropentanol and 1H,1H,7H-dodecafluoroheptanol (mass ratio 60:40), to prepare a composition 8 (viscosity: 0.0200 Pa·s).

Comparative Example 3

Preparation of Composition C3

The polymer compound 1 was dissolved at a concentration of 0.05% by mass in 1H,1H-pentafluoropropanol, to prepare a composition C3 (viscosity: 0.0041 Pa·s).

Comparative Example 4

Preparation of Composition C4

The polymer compound 4 was dissolved at a concentration of 0.05% by mass in 1H,1H,5H-octafluoropentanol, to prepare a composition C4 (viscosity: 0.0170 Pa·s).

Comparative Example 5

Preparation of Composition C5

The polymer compound 4 was dissolved at a concentration of 0.05% by mass in 1H,1H,7H-dodecafluoroheptanol, to prepare a composition C5 (viscosity: 0.0315 Pa·s).

<Evaluation of ink jet dischargeability>

Liquid droplets of each composition were discharged by an ink jet method, and dischargeability was evaluated according to the following criteria. The results are shown in Table 1.

○: Discharge as a droplet was obtained continuously for 5 minutes or more from the discharge start.

×: Discharge is charge as a droplet was not obtained, or discharge was not obtained as a droplet within 5 minutes from the discharge start.

<Evaluation of Occurrence of Ink Jet Clogging>

After droplets of each composition were discharged by an ink jet method for 1 minute, the discharge was stopped, and the occurrence of clogging of the ink jet head while the discharge was stopped was evaluated according to the following criteria. The obtained results are shown in Table 1.

○: No clogging occurred when left for 1 hour in an environment of 23° C. and 60% humidity, after 1 minute of discharge.

×: Clogging occurred when left for 1 hour in an environment of 23° C. and 60% humidity, after 1 minute of discharge.

TABLE 1

| | composition | viscosity (Pa · s) | dischargeability | clogging |
|---|---|---|---|---|
| Example 1 | 1 | 0.0177 | ○ | ○ |
| Example 2 | 2 | 0.0221 | ○ | ○ |

TABLE 1-continued

| | composition | viscosity (Pa · s) | dischargeability | clogging |
|---|---|---|---|---|
| Example 3 | 3 | 0.0247 | ○ | ○ |
| Example 4 | 4 | 0.0111 | ○ | ○ |
| Example 5 | 5 | 0.0200 | ○ | ○ |
| Example 6 | 6 | 0.0160 | ○ | ○ |
| Example 7 | 7 | 0.0090 | ○ | ○ |
| Example 8 | 8 | 0.0200 | ○ | ○ |
| Comparative Example 1 | C1 | 0.0143 | ○ | x |
| Comparative Example 2 | C2 | 0.0329 | x | ○ |
| Comparative Example 3 | C3 | 0.0041 | ○ | x |
| Comparative Example 4 | C4 | 0.0170 | ○ | x |
| Comparative Example 5 | C5 | 0.0315 | x | ○ |

<Evaluation of Film Formability>

A phosphorescent material was dissolved as a solid component in a mixed solvent of 4-methoxytoluene and cyclohexylbenzene (mass ratio 20:80) to a concentration of 1.5% by mass, to prepare a solution. The prepared solution was applied on a glass substrate by an ink jet method, then, vacuum-dried at 10 Pa, then, calcined for 10 minutes at 130° C. under standard pressure, to form a phosphorescent material layer having a thickness of 100 nm. The composition 5 was applied in a rectangle form of 30 mm length and 50 mm width on the phosphorescent material layer by an ink jet method, then, vacuum-dried at 10 Pa, then, calcined for 10 minutes at 130° C. under standard pressure, to form a film 1 with a thickness of 10 nm.

Films 2 to 8 were formed in the same manner as for the film 1, except that the kind of the composition and the thickness of the film were changed as shown in Table 2.

For each of the films 1 to 8, the difference between the width (50 mm) at the time of ink jet application and the width of each film after carrying out vacuum-drying and calcination was measured as the shrink amount (indicator for evaluation of film formability). The obtained results are shown in Table 2.

TABLE 2

| film | composition | thickness (nm) | shrink amount (mm) |
|---|---|---|---|
| 1 | 5 | 10 | 2 |
| 2 | 5 | 20 | 3 |
| 3 | 5 | 30 | 6 |
| 4 | 5 | 40 | 7.5 |
| 5 | 6 | 10 | 0 |
| 6 | 6 | 20 | 0.5 |
| 7 | 6 | 30 | 0.5 |
| 8 | 6 | 40 | 0.5 |

INDUSTRIAL APPLICABILITY

According to the present invention, a composition that is excellent in dischargeability by an ink jet method and is less likely to cause clogging of an ink jet apparatus and production methods of a film and a light emitting device using the composition can be provided.

The invention claimed is:

1. A composition comprising a fluorinated alcohol A represented by the formula (1) and having a boiling point of 50° C. or more and less than 150° C., a fluorinated alcohol B represented by the formula (1) and having a boiling point of 150° C. or more and less than 300° C. and a charge transportable compound, wherein
a ratio of said fluorinated alcohol B with respect to 100 parts by mass of the sum of said fluorinated alcohol A and said fluorinated alcohol B is 10 parts by mass to 90 parts by mass:

$$C_{nF}H_{2nF+1-mF}F_{nF}OH \qquad (1)$$

in the formula (1), nF is an integer of 1 to 12 and mF is an integer of 1 to 25, provided that $2nF+1 \geq mF$.

2. The composition according to claim 1, wherein a difference between the boiling point of said fluorinated alcohol A and the boiling point of said fluorinated alcohol B is 50° C. or less.

3. The composition according to claim 1, wherein nF in said fluorinated alcohol A is an integer of 1 to 10 and nF in said fluorinated alcohol B is an integer of 4 to 10.

4. The composition according to claim 3, wherein mF in said fluorinated alcohol A is an integer of 4 to 12 and mF in said fluorinated alcohol B is an integer of 4 to 12.

5. The composition according to claim 1, wherein said fluorinated alcohol A and said fluorinated alcohol B are each a linear alcohol.

6. The composition according to claim 1, wherein said charge transportable compound is at least one selected from the group consisting of aromatic hydrocarbon compounds, aromatic heterocyclic compounds, organic silane compounds, alkali metal salts and alkaline earth metal salts of aromatic hydrocarbon compounds, alkali metal salts and alkaline earth metal salts of aromatic heterocyclic compounds, alkali metal salts and alkaline earth metal salts of organic silane compounds, halides, oxide salts and carbonates of alkali metals, halides, oxide salts and carbonates of alkaline earth metals, and metal complexes.

7. The composition according to claim 1 wherein said charge transportable compound is a polymer compound.

8. The composition according to claim 1, further comprising water.

9. The composition according to claim 1, further comprising a solvent having a surface tension higher than that of said fluorinated alcohol A and said fluorinated alcohol B and having a boiling point higher than that of said fluorinated alcohol A and said fluorinated alcohol B.

10. A production method of a film, comprising a step of forming a film by an application method using the composition according to claim 1.

11. A production method of a light emitting device, comprising a step of forming a layer by an application method using the composition according to claim 1.

* * * * *